United States Patent
Dyer et al.

(10) Patent No.: US 7,442,586 B2
(45) Date of Patent: Oct. 28, 2008

(54) SOI SUBSTRATE AND SOI DEVICE, AND METHOD FOR FORMING THE SAME

(75) Inventors: Thomas W. Dyer, Pleasant Valley, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 11/308,516

(22) Filed: Mar. 31, 2006

(65) Prior Publication Data

US 2007/0228465 A1    Oct. 4, 2007

(51) Int. Cl.
   *H01L 21/00*   (2006.01)
   *H01L 21/84*   (2006.01)
   *H01L 21/20*   (2006.01)
   *H01L 21/36*   (2006.01)

(52) U.S. Cl. .................. 438/149; 438/479; 438/480; 438/517

(58) Field of Classification Search .............. 438/149, 438/479–480, 517
   See application file for complete search history.

(56) References Cited

U.S. PATENT DOCUMENTS 6,271,566 B1 * 8/2001 Tsuchiaki .................. 257/347
6,528,853 B2 * 3/2003 Christensen et al. ........ 257/353
6,876,037 B2 * 4/2005 Wei et al. ................... 257/347
7,327,008 B2 * 2/2008 Williams .................... 438/479

* cited by examiner

*Primary Examiner*—Cuong Q Nguyen
(74) *Attorney, Agent, or Firm*—Scully, Scott, Murphy & Presser, P.C.; H. Daniel Schnurmann

(57) ABSTRACT

An improved semiconductor-on-insulator (SOI) substrate is provided, which has a substantially planar upper surface and comprises at least first and second patterned buried insulator layers. Specifically, the first patterned buried insulator layer has a first thickness and is located in the SOI substrate at a first depth from the substantially planar upper surface, and the second patterned buried insulator layer has a second, different thickness and is located in the SOI substrate at a second, different depth from the substantially planar upper surface. The first and second patterned buried insulator layers are separated from each other by one or more interlayer gaps, which provide body contacts for the SOI substrate. The SOI substrate of the present invention can be readily formed by a method that includes at least two independent ion implantation steps.

7 Claims, 7 Drawing Sheets

SOI SUBSTRATE AND SOI DEVICE, AND METHOD FOR FORMING THE SAME

FIELD OF THE INVENTION

The present invention generally relates to improved semiconductor-on-insulator (SOI) substrates and SOI devices, and methods for forming such SOI substrates and SOI devices. More specifically, the present invention relates to SOI substrates that contain first and second patterned buried insulator layers having different thicknesses and located at different depths of the SOI substrates, and SOI devices that are formed in such SOI substrates with the first and second patterned buried insulator layers self-aligned to the SOI device junctions.

BACKGROUND OF THE INVENTION

Semiconductor-on-insulator (SOI) technology is becoming increasingly important in semiconductor processing. A SOI substrate structure typically contains a buried insulator layer, which functions to electrically isolate an ultra-thin semiconductor device layer from a base semiconductor substrate. Active devices, such as transistors, with fully depleted channel regions are typically formed in the ultra-thin semiconductor device layer of the SOI substrate.

Such devices (i.e., fully depleted SOI devices) offer many advantages over their bulk or partially depleted counterparts, including, but not limited to: lower junction capacitance (especially lower sidewall junction capacitance in comparison with partially depleted SOI devices), better off-current control (i.e., lower leakage current), improved roll-off characteristics and sub-threshold swing.

However, one disadvantage of the fully depleted SOI devices is that they typically have higher series resistance due to the limited junction depth in the ultra-thin semiconductor device layer. Silicidation of the ultra-thin semiconductor device layer also presents a problem due to the limited amount of silicon available in the ultra-thin semiconductor device layer for silicidation. Therefore, raised source and drain structures are typically employed in ultra-thin SOI devices, which increases the manufacturing costs as well as the defect density of the SOI devices. Moreover, some major stress methods (such as embedded SiGe or SiC) that have been recently developed for stress engineering may not be compatible with ultra-thin SOI configurations due to the limited junction depth.

Further, because the ultra-thin semiconductor device layer is completely isolated from the base semiconductor substrate without any body contact, a charge can build up in the semiconductor device layer, which in turn leads to undesirable self-heating of the SOI devices and deleterious floating body effects that adversely impact the device performance.

There is therefore a need for improved SOI substrates and SOI devices with reduced floating body effects and reduced contact resistance, without compromising the advantages associated with the ultra-thin semiconductor device layer. There is also a need for a simple and effective method of fabricating the improved SOI substrates and SOI devices at reduced costs with fewer defects.

SUMMARY OF THE INVENTION

The present invention solves the above-described problems of conventional SOI structures by providing improved SOI substrates that comprise first and second patterned buried insulator layers having different thicknesses and located at varying depths of the SOI substrates. Further, improved SOI devices can be formed in such SOI substrates with the first and second patterned buried insulator layers self-aligned to the SOI device junctions in such a manner as to reduce the floating body effects and the contact resistance, but without increasing the junction leakage and the junction capacitance.

In one aspect, the present invention relates to a semiconductor-on-insulator (SOI) substrate having a substantially planar upper surface and comprising at least first and second patterned buried insulator layers. The first patterned buried insulator layer has a first thickness and is located in the SOI substrate at a first depth from the substantially planar upper surface. The second patterned buried insulator layer has a second, different thickness and is located in the SOI substrate at a second, different depth from the substantially planar upper surface. The first and second patterned buried insulator layers are separated from each other by one or more interlayer gaps.

Preferably, the first depth is larger than the second depth. More preferably, the first depth ranges from about 20 nm to about 200 nm, and the second depth ranges from about 10 nm to about 100 nm.

The first thickness is preferably larger than the second thickness. More specifically, the first thickness typically ranges from about 20 nm to about 400 nm, and the second thickness ranges from about 10 nm to about 200 nm.

In a preferred, but not necessary, embodiment of the present invention, the first patterned buried insulator layer contains at least a first portion and a second portion that are separated from each other by an intralayer gap. The second patterned buried insulator layer is located above the intralayer gap of the first patterned buried insulator layer and is separated from the first and second portions of the first patterned buried insulator layer by two interlayer gaps.

In another aspect, the present invention relates to a semiconductor device that comprises at least one field effect transistor (FET). Specifically, the at least one FET comprises: (1) source and drain regions located in a semiconductor-on-insulator (SOI) substrate above a first patterned buried insulator layer, wherein the SOI substrate has a substantially planar upper surface, wherein the first patterned buried insulator layer has a first thickness and is located in the SOI substrate at a first depth from the substantially planar upper surface of the SOI substrate, and (2) a channel region located in the SOI substrate between the source and drain regions and above a second patterned buried insulator layer, wherein the second patterned buried insulator layer has a second, different thickness and is located in the SOI substrate at a second, different depth from the substantially planar upper surface of the SOI substrate, and wherein the first and second patterned buried insulator layers are separated from each other by one or more interlayer gaps.

Preferably, but not necessarily, the first patterned buried insulator layer comprises first and second portions that are separated from each other by an intralayer gap. The source region of the at least one FET is located over the first portion of the first patterned buried insulator layer, and the drain region of the at least one FET is located over the second portion of the first patterned buried insulator layer. The second patterned buried insulator layer is located above the intralayer gap of the first patterned buried insulator layer and is separated from the first and second portions of the first patterned buried insulator layer by two interlayer gaps.

In this manner, the first and second patterned buried insulator layers of the SOI substrate are self-aligned to the channel regions and source/drain regions of the at least one FET.

When the first patterned buried insulator layer is located at a relatively deep depth in the SOI substrate and the second pattern buried insulator layer is located at a relatively shallow depth in the SOI substrate, deep junctions at the FET source and drain regions as well as a thin semiconductor body at the FET channel region are concurrently provided in the FET, thereby resulting in reduced junction capacitance, excellent sub-threshold swing and improved short-channel effects, but without compromising the advantages associated with the ultra-thin channel.

Further, the intralayer and interlayer gaps in the first and second patterned buried insulator layers provide body contacts between the semiconductor device layer above the first and second patterned buried insulator layers and the base semiconductor substrate underneath such patterned buried insulator layers. Correspondingly, certain problems typically associated with fully depleted SOI devices, such as self-heating and floating body effect, can be eliminated.

In still another aspect, the present invention relates to a method for forming a semiconductor-on-insulator (SOI) substrate, which comprises:

a. forming a semiconductor substrate having a substantially planar upper surface with predetermined first and second implantation regions;

b. conducting at least a first ion implantation step to selectively implant oxygen ions, nitrogen ions, or both oxygen and nitrogen ions into the first, but not the second, implantation region of the semiconductor substrate at a first depth from the substantially planar upper surface;

c. conducting at least a second ion implantation step to selectively implant oxygen ions, nitrogen ions, or both oxygen and nitrogen ions into the second, but not the first, implantation region of the semiconductor substrate at a second, different depth from the substantially planar upper surface; and d. conducting one or more annealing steps to convert the implanted oxygen ions, nitrogen ions, or both oxygen and nitrogen ions in the first and second implantation regions of the semiconductor substrate into first and second patterned buried insulator layers, respectively, which are located at different depths from the substantially planar upper surface and are separated from each other by one or more interlayer gaps.

In a specific embodiment of the present invention, a field effect transistor (FET) is further formed in the SOI substrate, which comprises: (1) source and drain regions located in the SOI substrate above the first patterned buried insulator layer, and (2) a channel region located in the SOI substrate between the source and drain regions and above the second patterned buried insulator layer.

Preferably, the first implantation region comprises first and second portions that are separated from each other by a gap, so that the first patterned buried insulator layer comprises first and second portions separated from each other by an intralayer gap, and the second patterned buried insulator layer is located above the intralayer gap and is separated from the first and second portions of the first patterned buried insulator layer by two interlayer gaps. More preferably, an FET is formed in the SOI substrate and comprises: (1) a source region located in the SOI substrate over the first portion of the first patterned buried insulator layer, (2) a drain region located in the SOI substrate over the second portion of the first patterned buried insulator layer, and (3) a channel region located in the SOI substrate between the source and drain regions and above the second patterned buried insulator layer.

Other aspects, features and advantages of the invention will be more fully apparent from the ensuing disclosure and appended claims.

DETAILED DESCRIPTION OF THE INVENTION

Figure 1:
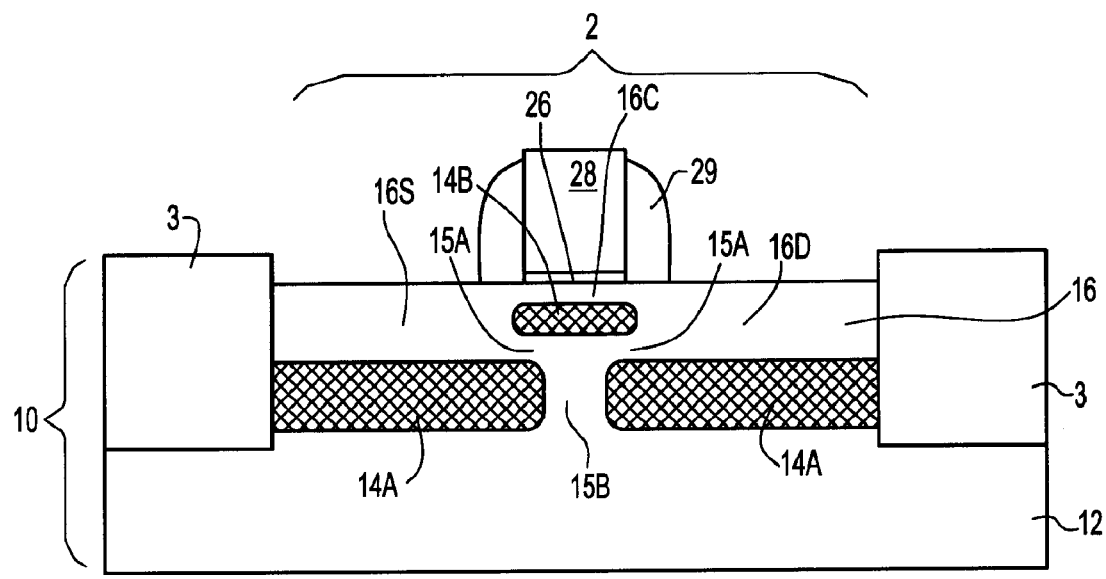
FIG. 1 shows a cross-sectional view of an exemplary SOI device containing an FET with a first patterned buried insulator layer located relatively deeper in a SOI substrate and aligned to the source and drain (S/D) regions of the FET and a second patterned buried insulator layer located relatively shallower in the SOI substrate and aligned to the channel region of the FET, according to one embodiment of the present invention.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The term "patterned" as used herein refers to the discontinuity of a layered structure. For example, a patterned buried insulator layer is discontinuous in the SOI substrate, i.e., it extends to certain regions of the SOI substrate, but is completely absent in other regions of the SOI substrate.

The term "substantially planar" as used herein refers to the smoothness of a surface defined by surface protrusions or depressions of less than about 10 nm in height or depth.

The term "depth" as used in association with the patterned buried insulator layer (or portions thereof) refers to the average distance between an upper surface of the patterned buried insulator layer (or portions thereof) and an upper surface of the substrate in which the patterned buried insulator layer is located.

The term "thickness" as used herein refers to the average thickness of a layer or similar structure.

The term "substantially the same" as used herein refers to a parameter variation of not more than ±10%.

The present invention provides improved SOI substrates that comprise first and second patterned buried insulator layers located at different depths of such SOI substrates. Specifically, each of the SOI substrates of the present invention has a substantially planar upper surface and comprises: (1) a first patterned buried insulator layer located in the SOI substrate at a first depth from the substantially planar upper surface of the SOI substrate, and (2) a second patterned buried insulator layer located in the SOI substrate at a second, different depth from the substantially planar upper surface of the SOI substrate, wherein the first and second patterned buried insulator layers are separated from each other by one or more interlayer gaps.

The present invention also provides improved SOI devices, which are formed in the above-described SOI substrates. Specifically, the first patterned buried insulator layer is self-aligned to the source and drain regions of the SOI device, and the second patterned buried insulator layer is self-aligned to the channel region of the SOI device. The interlayer gaps between the first and second patterned buried insulator layers further provide body contacts for the SOI device. Therefore, the SOI device is characterized by reduced floating body effects, reduced contact resistance, lower junction capacitance, improved roll-off characteristics and sub-threshold swing, and reduced junction leakage.

FIG. 1 shows a cross-sectional view of an exemplary SOI device, which contains an FET 2 and located in a SOI substrate 10.

The SOI substrate 10 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it is preferred that the SOI substrate 10 be composed of a Si-containing semiconductor material, i.e., a semiconductor material that includes silicon. Further, the SOI substrate 10 may be doped, undoped, or contain both doped and undoped regions therein (not shown).

The SOI substrate 10 has a substantially planar upper surface, and it contains a first patterned (i.e., discontinuous) buried insulator layer 14A and a second patterned buried insulator layer 14B therein, which jointly define a base semiconductor substrate 12 located under the first and second patterned buried insulator layer 14A and 14B and a semiconductor device layer 16 located above the first and second patterned buried insulator layer 14A and 14B.

The first and second patterned buried insulator layers 14A and 14B may comprise any suitable insulator material(s), and they typically comprise an oxide, a nitride, or an oxynitride in either a crystalline phase or a non-crystalline phase. The first patterned buried insulator layer 14A extends only to certain regions (e.g., source region 16S and drain region 16D) of the SOI substrate 10, but is completely absent from other regions (e.g., channel region 16C) of the SOI substrate 10. Similarly, the second patterned buried insulator layer 14B extends only to certain regions (e.g., channel region 16C) of the SOI substrate 10, but is completely absent from other regions (e.g., source region 16S and drain region 16D) of the SOI substrate 10.

The first patterned buried insulator layer 14A is located in the SOI substrate 10 at a first, relatively deeper depth from the upper surface of the SOI substrate 10, and the second patterned buried insulator layer 14B is located in the SOI substrate 10 at a second, relatively shallower depth from the upper surface of the SOI substrate 10, as shown in FIG. 1. Preferably, the first depth ranges from about 20 nm to about 200 nm, and the second depth ranges from about 10 nm to about 100 nm. More preferably, the first depth ranges from about 50 nm to about 100 nm, and the second depth ranges from about 10 nm to about 20 nm.

The first patterned buried insulator layer 14A preferably has a first, relatively larger thickness, and the second patterned buried insulator layer 14B preferably has a second, relatively smaller thickness, as shown in FIG. 1. More preferably, the first thickness ranges from about 20 nm to about 400 nm, and the second thickness ranges from about 10 nm to about 200 nm.

The first patterned buried insulator layer 14A may comprise first and second portions that are separated from each other by an intralayer gap 15B. Specifically, the first portion of the first patterned buried insulator layer 14A is aligned with the source region 16S of the FET 2, and the second portion of the second buried insulator layer 14A is aligned with the drain region 16D of the FET 2, as shown in FIG. 1. The second patterned buried insulator layer 14B is separated from both the first and second portions of the first patterned buried insulator layer 14A by at least two interlayer gaps 15A.

One or more isolation regions 3 are typically formed in the SOI substrate 10 to provide isolation between adjacent FETs. The isolation regions 3 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

The FET can be either an n-channel FET (n-FET) or a p-channel FET (p-FET). The FET 2 comprises at least a source region 16S, a channel region 16C, and a drain region 16D, which are all located in the semiconductor device layer 16 of the SOI substrate 10, as shown in FIG. 1. Specifically, the source region 16S of the FET 2 is located over the first portion of the first patterned buried insulator layer 14A and therefore has a relatively deeper source junction depth. The drain region 16D of the FET 2 is located over the second portion of the first patterned buried insulator layer 14A and also has a relatively deeper drain junction depth. The channel region 16C is located over the second patterned buried insulator layer 14B and therefore has a relatively shallow channel junction depth.

Further, the interlayer gaps 15A and the intralayer gap 15B provide body contacts between the upper semiconductor device layer 16 and the lower base semiconductor substrate 12 through the first and second patterned buried insulator layers 14A and 14.

The FET 2 further comprises a gate dielectric 26, a gate electrode 28, and one or more optional sidewall spacers 29.

Note that while FIG. 1 illustratively demonstrate an exemplary SOI substrate with an exemplary SOI device according to specific embodiments of the present invention, it is clear that a person ordinarily skilled in the art can readily modify such an exemplary substrate and device structure for adaptation to specific application requirements, consistent with the above descriptions. For example, although the SOI substrate as shown in FIG. 1 contains only two patterned buried insulator layers located at two different depths in the SOI substrate, it is understood that the SOI substrate may contain additional patterned buried insulator layers located at additional depths. Further, the SOI substrates of the present invention can be readily used for forming other semiconductor devices, such as transistors, diodes, capacitors, resistors, inductors, etc., besides the FET as shown in FIG. 1.

The present invention provides not only an improved SOI substrate and device structure as described hereinabove, but also an improved method for forming such a SOI substrate and device structure at reduced costs with fewer defects. Such an improved method will be illustrated in greater details hereinafter with reference to FIGS. 2-13.

Figure 2:
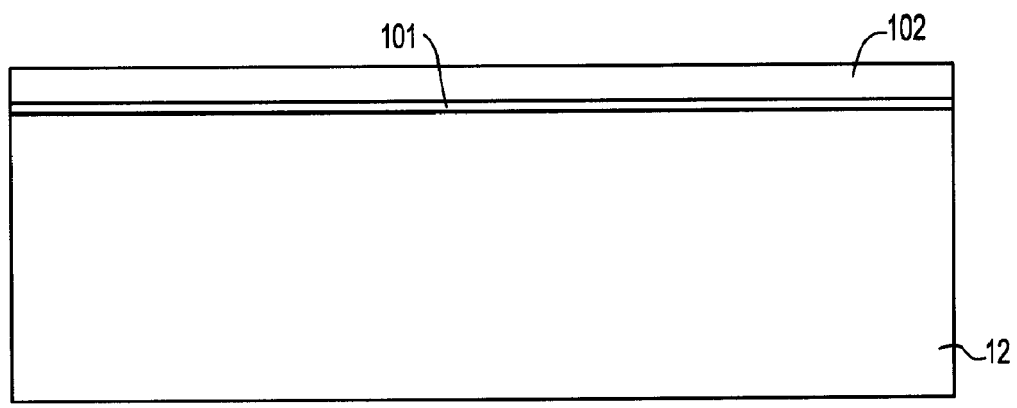
FIG. 2-14 show exemplary processing steps for forming the SOI device of FIG. 1 by using two ion implantation steps, according to one embodiment of the present invention.

A base semiconductor substrate 12, which is either a bulk semiconductor substrate containing no buried insulator material or a SOI substrate containing one or more preformed buried insulator layers (not shown), is first provided. The base semiconductor substrate 12 has a substantially planar upper surface. A pad oxide layer 101 and a pad nitride layer 102 are formed over the substantially planar upper surface of the base semiconductor substrate 12, as shown in FIG. 2.

Figure 3:
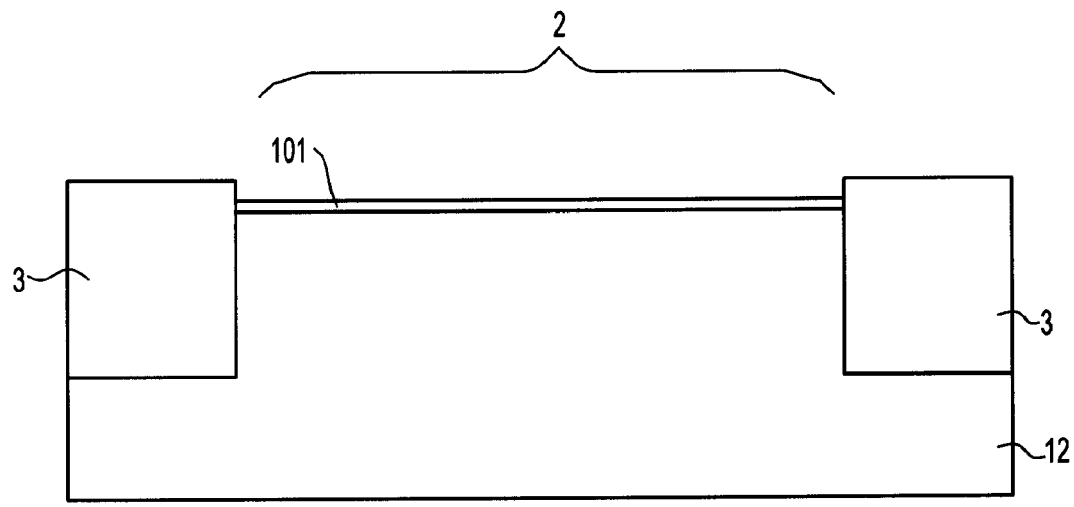

One or more isolation regions 3 are then formed in the base semiconductor substrate 12 to provide isolation between adjacent device regions, as shown in FIG. 3. The isolation regions 3 are preferably trench isolation regions formed utilizing a conventional trench isolation process well known to those skilled in the art, as described hereinabove. Note that the isolation regions 3 can be formed either before (as shown in FIG. 3) or after (not shown) formation of the first and second buried insulator layers 14A and 14B. The pad nitride layer 102 is removed by stripping after formation of the isolation regions 3.

Figure 4:
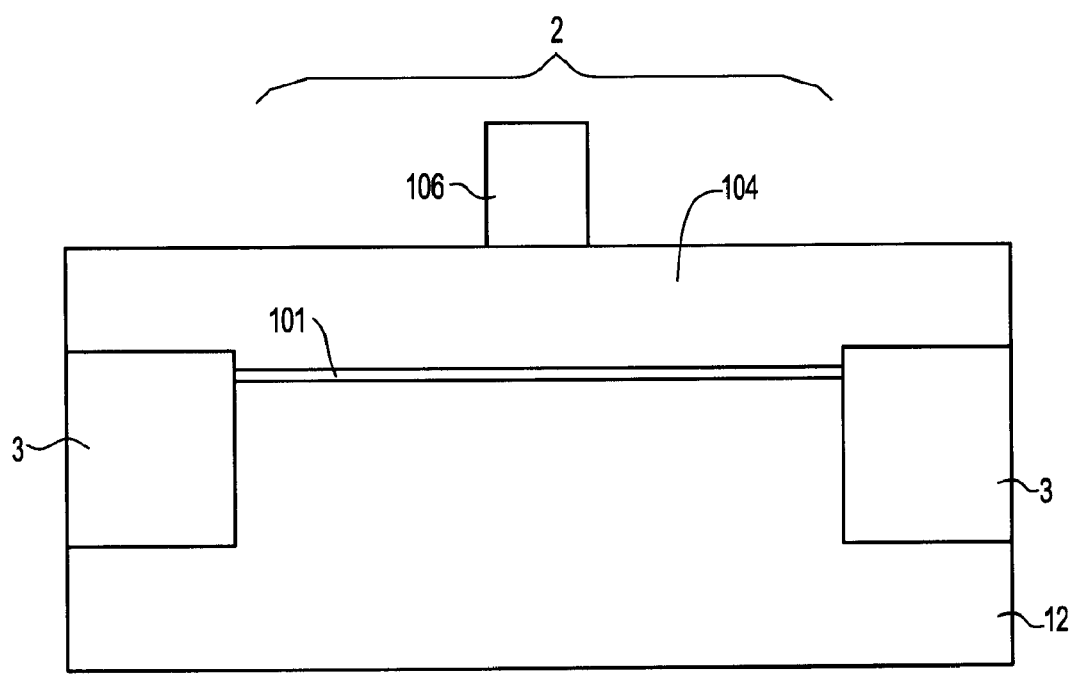

Next, a sacrificial masking layer 104 is deposited over the pad oxide layer 101, followed by formation of a patterned resist 106 thereover, as shown in FIG. 4. The sacrificial masking layer 104 comprises polysilicon or any other suitable material that can be selectively etched against nitride and oxide. The patterned resist 106 is formed by conventional lithography and resist development, and it defines a channel region to be subsequently formed in the FET 2.

Figure 5:
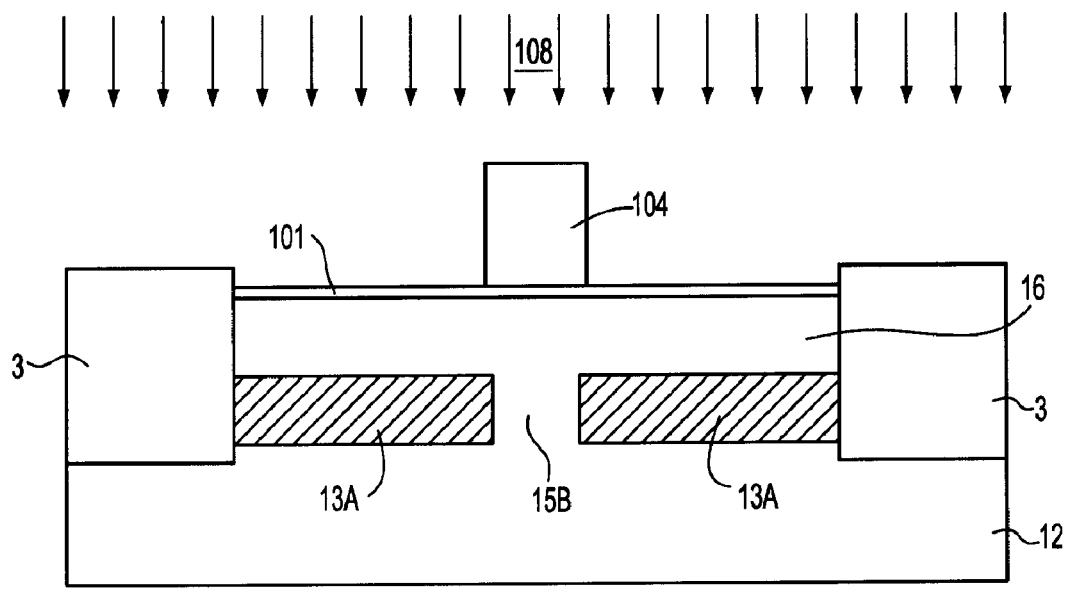

The sacrificial masking layer 104 is patterned into a sacrificial mask 104 using the patterned resist 106 as a mask, and the patterned resist 106 is subsequently removed by stripping, as shown in FIG. 5.

A first ion implantation step 108 is then carried out using the sacrificial mask 104 to selectively implant oxygen and/or nitrogen ions into a first implantation region 13A that is not covered by the sacrificial mask 104, as shown in FIG. 5. Further, the first implantation region 13A include a first portion and a second portion that are separated from each other by a gap 15B.

The first ion implantation step 108 as shown in FIG. 5 is typically carried out using an energy beam having an energy level of from about 60 KeV to about 200 KeV and an ion dose from about $5.0\times10^{16}$ cm$^{-2}$ to about $5.0\times10^{18}$ cm$^{-2}$ at a temperature ranging from about 20° C. to about 800° C. Preferably, the first ion implantation step is carried out using an energy beam having an energy level of from about 100 KeV to about 150 KeV and an ion dose from about $2.0\times10^{17}$ cm$^{-2}$ to about $2.0\times10^{18}$ cm$^{-2}$ at a temperature ranging from about 20° C. to about 600° C. If desired, the first ion implantation step may be followed by one or more supplemental ion implantation steps (not shown), which are carried over the same structure but under different implantation conditions, to form a high quality implantation region 13A.

Figure 6:
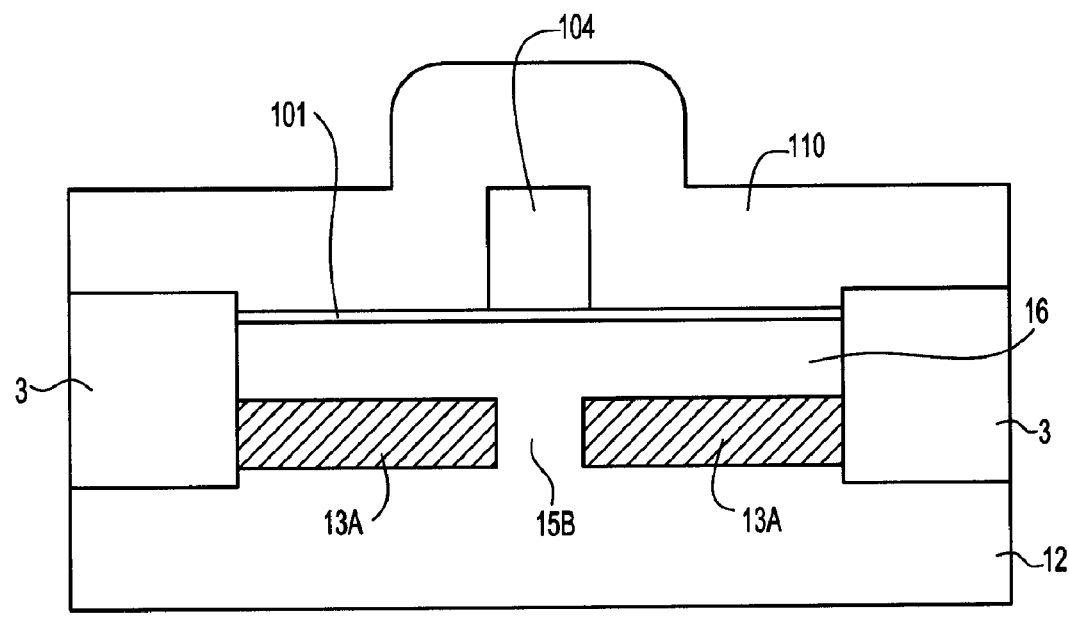

Subsequently, a blanket dielectric mask layer 110 is formed over the entire structure, as shown in FIG. 6. The blanket dielectric mask layer 110 may comprise any suitable dielectric masking material(s), including, but not limited to: oxides, nitrides, and oxynitrides. Preferably, but not necessarily, the blanket dielectric mask layer 110 comprises silicon nitride. The blanket dielectric mask layer 110 may be formed by any conventional deposition process, including, but not limited to: chemical vapor deposition (CVD), plasma-enhanced CVD, sputtering, evaporation, chemical solution deposition, and other like deposition processes.

The physical thickness of the blanket dielectric mask layer 110 is adjusted so as to completely block implantation of oxygen and/or nitrogen ions in a subsequent ion implantation step, and it therefore depends on the specific energy level of the implanted ions (which determines the ion implantation depth under normal conditions, i.e., when no masking structure is provided). Typically, the blanket dielectric mask layer 110 has a thickness ranging from about 100 nm to about 2000 nm, and more typically from about 400 nm to about 1200 nm.

Figure 7:
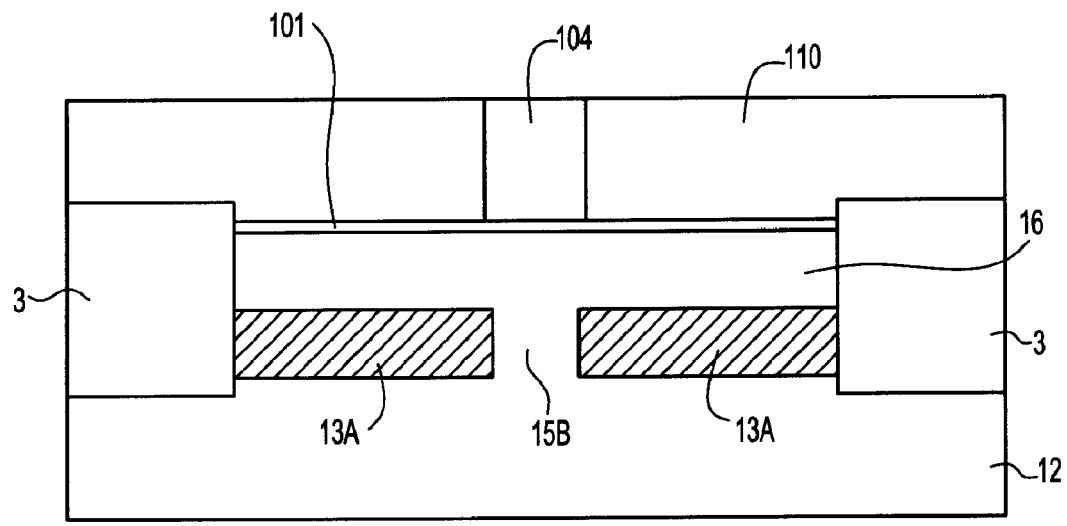

The blanket dielectric mask layer 110 is then planarized (e.g., by chemical mechanical polishing) to remove the excess dielectric mask material from over the sacrificial mask 104, thereby exposing an upper surface of the sacrificial mask 104, as shown in FIG. 7.

Figure 8:
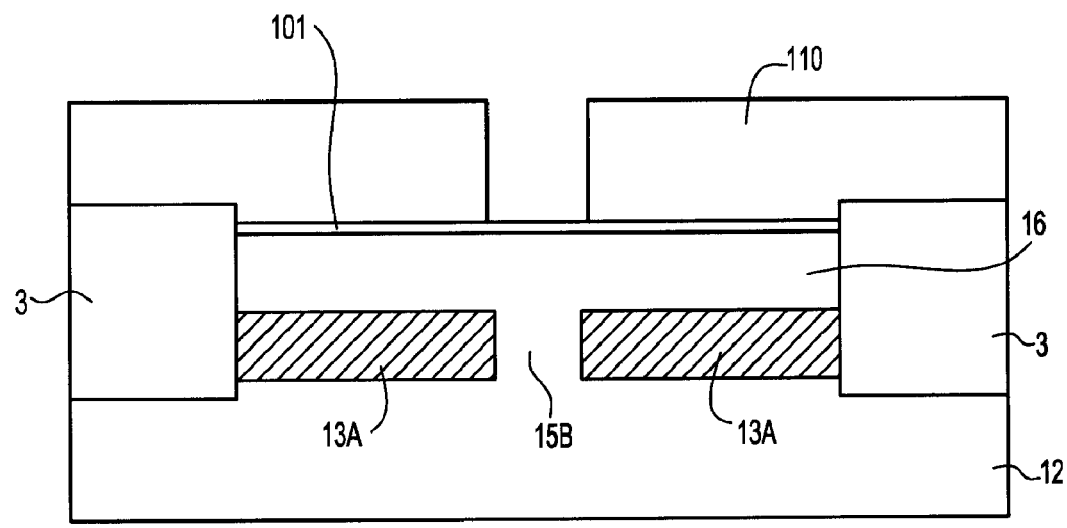
Figure 9:
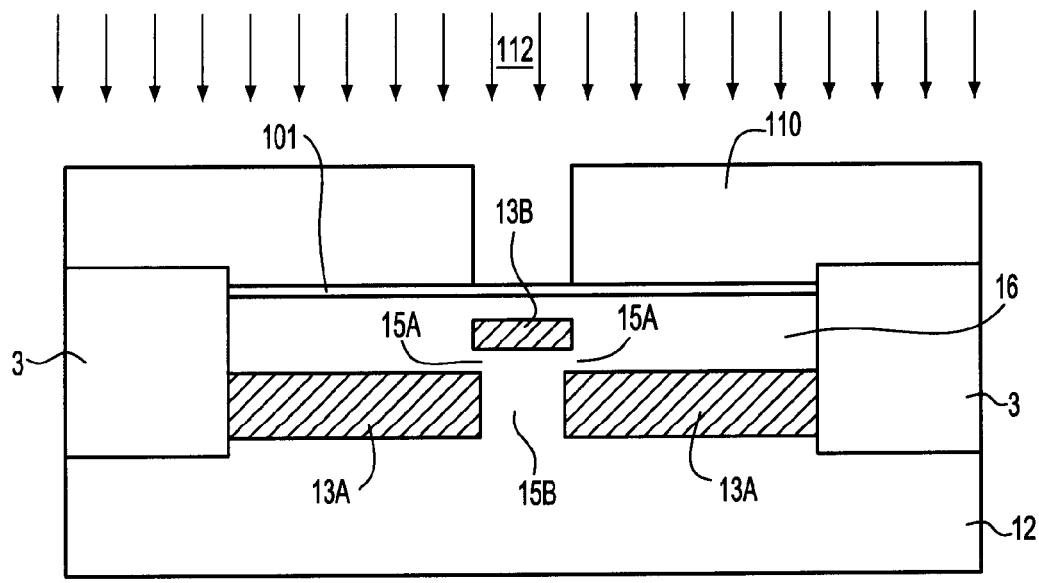

Next, a selective etching step is carried out to selectively remove the sacrificial mask 104 against the planarized dielectric mask layer 110 (as shown in FIG. 8), followed by a second ion implantation step 112 using the dielectric mask layer 110 as a mask to selectively implant oxygen and/or nitrogen ions into a second implantation region 13B that is not covered by the dielectric mask layer 110 (as shown in FIG. 9). The second implantation region 13B is separated from the first and second portions of the first implantation region 13A by two gaps 15A.

The second ion implantation step 108 as shown in FIG. 9 is typically carried out using an energy beam having an energy level and energy range that is lower than those used the first ion implantation step. Correspondingly, the implantation depth (which is determined by the energy level) and the thickness (which is determined by the energy range) of the second implantation region 13B are both smaller than those of the first implantation region 13A, as shown in FIG. 9.

Preferably, the first ion implantation step is carried out using an energy beam having an energy level of from about 100 KeV to about 150 KeV and an ion dose from about $2\times10^{17}$ cm$^{-2}$ to about $2\times10^{18}$ cm$^{-2}$ at a temperature ranging from about 20° C. to about 600° C. If desired, the second ion implantation step may be followed by one or more supplemental ion implantation steps (not shown), which are carried over the same structure but under different implantation conditions, to form a high quality implantation region 13B.

Next, the entire structure is annealed at a sufficiently high temperature to convert the implanted oxygen and/or nitrogen ions in the first and second implantation regions 13A and 13B into buried insulator material(s) such as, for example, oxides, nitrides, or oxynitrides.

The annealing is typically carried out at a temperature of above 1250° C., and more typically at a temperature ranging from about 1300° C. to about 1350° C. Duration of annealing typically ranges from about 1 hour to about 100 hours, with a duration of from about 2 hours to about 24 hours being more typical. Preferably, the annealing is carried out in an oxidizing ambient that includes from about 0.1% to about 100% oxygen (by total volume) and from about 99.9% to about 0% inert gas such as He, Ar, and N$_2$. In one preferred embodiment, Ar is employed as the inert gas. More preferably, the annealing step of the present invention is carried out in an oxidizing ambient that includes from about 0.1% to about 50% oxygen (by total volume) and from about 50% to about 99.9% inert gas.

The annealing step may be carried out by simply heating the substrate at a specific temperature ramp rate to the targeted annealing temperature, or various ramp and soak cycles may be employed. During the various ramp and soak cycles, it is possible to vary the content of the annealing ambient within the ranges mentioned hereinabove.

Figure 10:
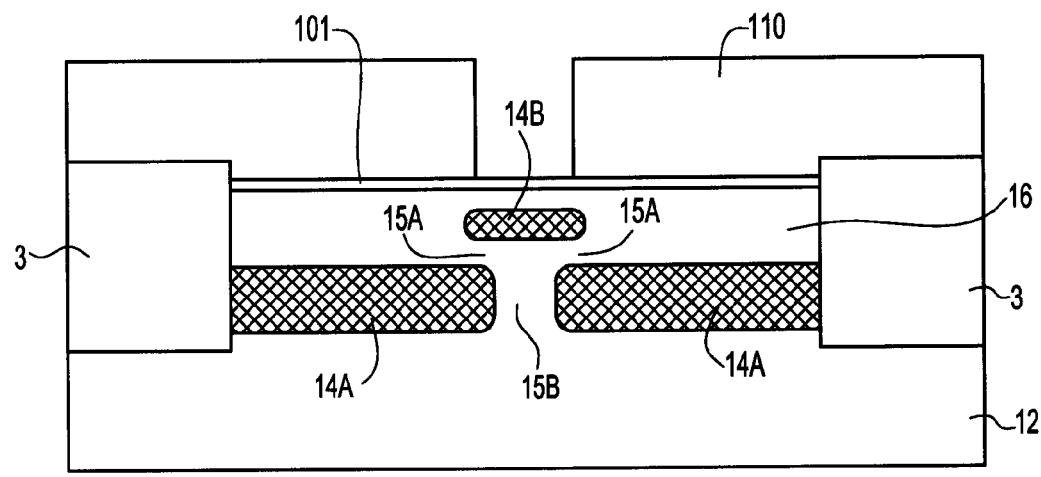

As a result, the first and second implantation regions 13A and 13B are converted into corresponding first and second patterned buried insulator layers 14A and 14B, as shown in FIG. 10. The first and second patterned buried insulator layers 14A and 14B so formed have different thicknesses and are located in different depths. Further, the first patterned buried insulator layer 14A comprises first and second portions that are separated from each other by an intralayer gap 15B, while the second patterned buried insulator layer 14b are separated from the first and second portions of the first patterned buried insulator layer 14A by two interlayer gaps 15A.

Figure 11:
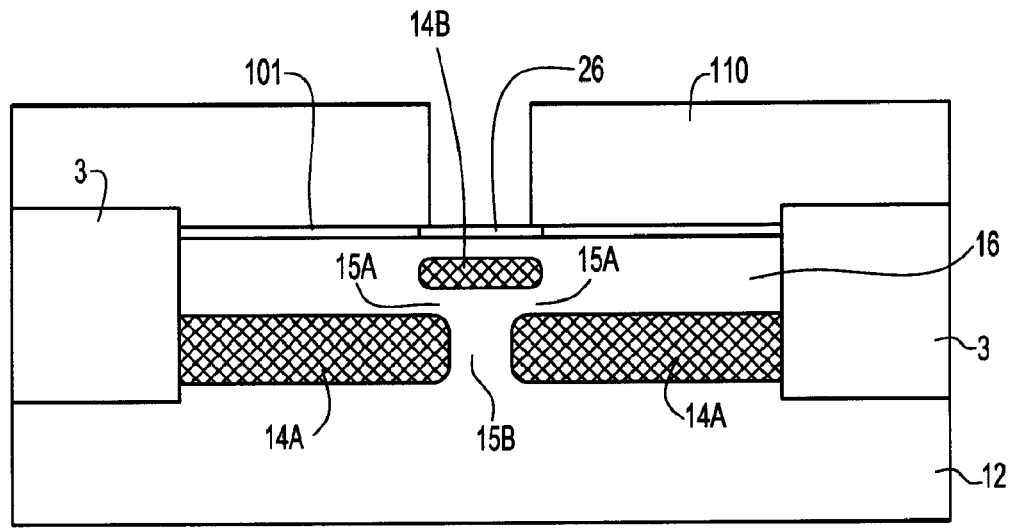

After the annealing, a selective etching step is carried out using a diluted hydrofluoric acid etching solution to selectively remove a portion of the pad oxide layer 101 that is not covered by the planarized dielectric mask layer 110, followed by formation of a gate dielectric layer 26 in place of the pad oxide layer 101, as shown in FIG. 11. The gate dielectric layer 26 may comprise any suitable dielectric masking material(s), including, but not limited to: oxides, nitrides, and oxynitrides. Preferably, but not necessarily, the gate dielectric layer 26 comprises silicon oxide.

Figure 12:
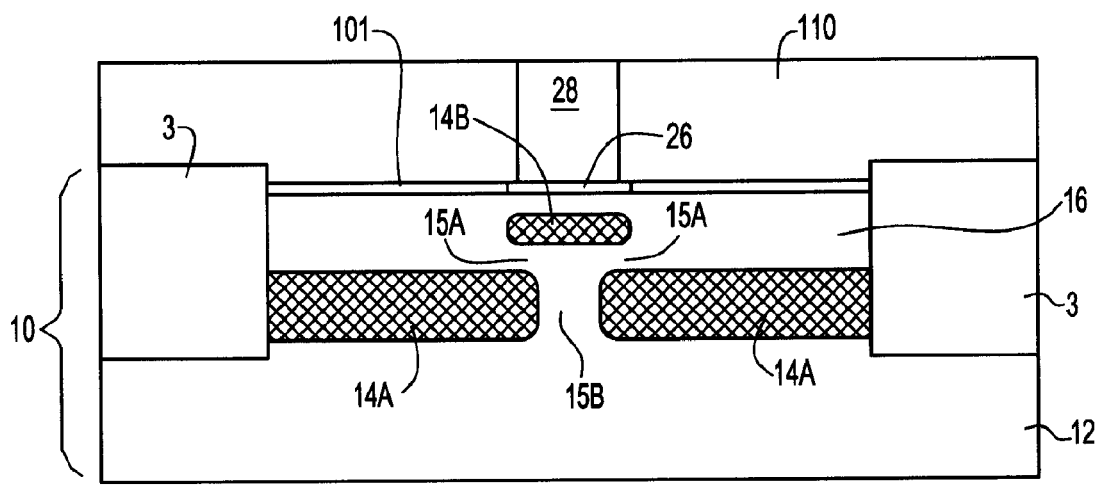

A gate conductor 28 is subsequently deposited over the gate dielectric layer 26, as shown in FIG. 12. The gate conductor 28 may comprise any suitable conductive materials, such as metals, metal alloys, metal nitrides, metal silicides, or a doped semiconductor material such as doped Si or SiGe alloy in polycrystalline or amorphous form.

Figure 13:
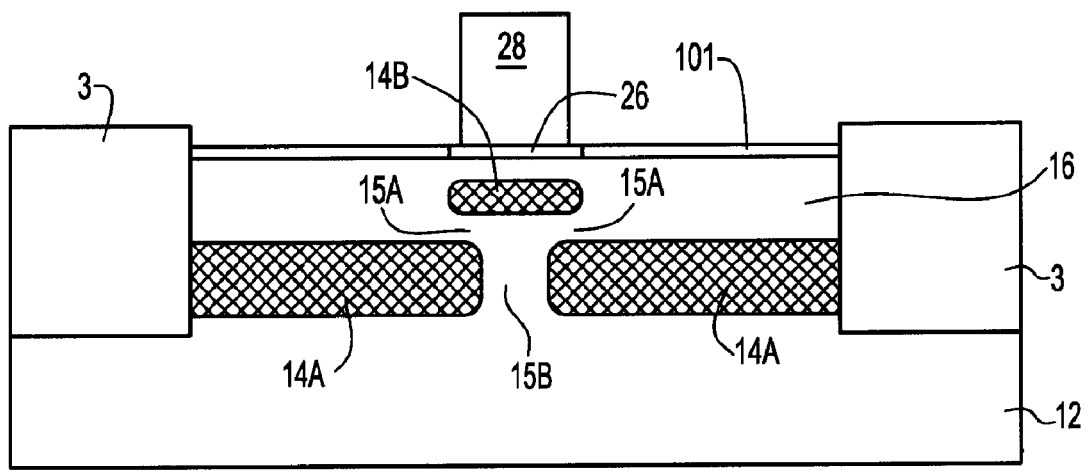
Figure 14:
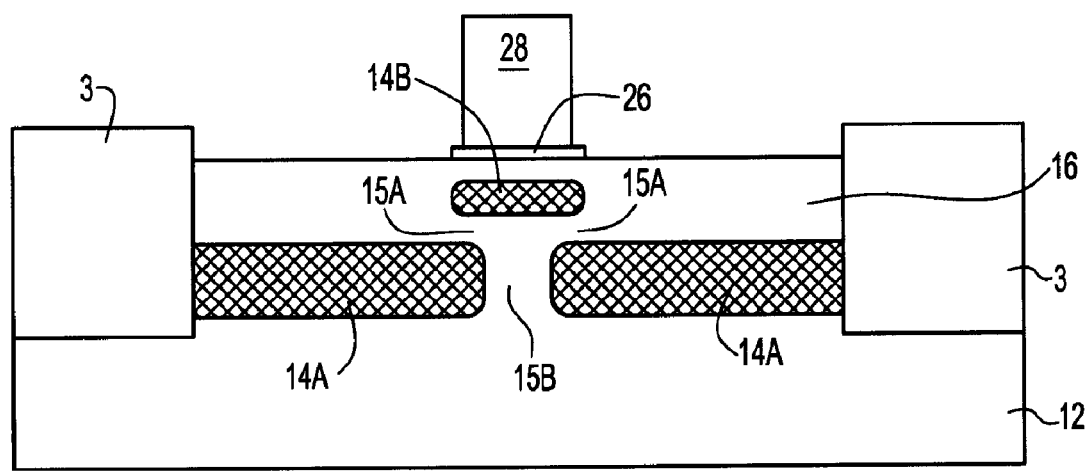

Next, the planarized dielectric mask layer 110 and the remaining pad oxide layer 101 are sequentially removed from the substrate surface, as shown in FIGS. 13 and 14.

Conventional CMOS processing steps can then be carried out to form optional sidewall spacers 29, source/drain regions 16S and 16D, and optional source/drain extension regions (not shown), as illustrated in FIG. 1. Details of such conventional CMOS processing steps are not described herein.

While FIGS. 1-14 illustratively demonstrate an exemplary device structure and processing steps that can be used to form such a device structure, according to specific embodiments of the present invention, it is clear that a person ordinarily skilled in the art can readily modify the demonstrated device structure as well as the process steps for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a semiconductor-on-insulator (S01) substrate, comprising:
    forming a semiconductor substrate having a substantially planar upper surface with predetermined first and second implantation regions;
    conducting at least a first ion implantation step to selectively implant oxygen ions, nitrogen ions, or both oxygen and nitrogen ions into the first, but not the second, implantation region of the semiconductor substrate at a first depth from the substantially planar upper surface;
    conducting at least a second ion implantation step to selectively implant oxygen ions, nitrogen ions, or both oxygen and nitrogen ions into the second, but not the first, implantation region of the semiconductor substrate at a second, different depth from the substantially planar upper surface;
    conducting one or more annealing steps to convert the implanted oxygen ions, nitrogen ions, or both oxygen and nitrogen ions in the first and second implantation regions of the semiconductor substrate into first and second patterned buried insulator layers, respectively, which are located at different depths from the substantially planar upper surface and are separated from each other by one or more interlayer gaps; and
    forming a field effect transistor (FET) that comprises: (1) source and drain regions located in the SOI substrate above the first patterned buried insulator layer, and (2) a channel region located in the SOI substrate between the source and drain regions and above the second patterned buried insulator layer.

2. The method of claim 1, wherein the first depth is larger than the second depth.

3. The method of claim 2, wherein the first depth ranges from about 20 nm to about 200 nm, and wherein the second depth ranges from about 10 nm to about 100nm.

4. The method of claim 1, wherein the first patterned buried insulator layer is thicker than the second patterned buried insulator layer.

5. The method of claim 4, wherein the first patterned buried insulator layer has a thickness ranging from about 20 nm to about 400 nm, and wherein the second patterned buried insulator layer has a thickness ranging from about 10 nm to about 200 nm 6. A for forming a semiconductor-on-insulator (SOI) substrate, comprising:
    forming a semiconductor substrate having a substantially planar upper surface with predetermined first and second implantation regions;
    conducting at least a first ion implantation step to selectively implant oxygen ions, nitrogen ions, or both oxygen and nitrogen ions into the first, but not the second, implantation region of the semiconductor substrate at a first depth from the substantially planar upper surface;
    conducting at least a second ion implantation step to selectively implant oxygen ions, nitrogen ions, or both oxygen and nitrogen ions into the second, but not the first, implantation region of the semiconductor substrate at a second, different depth from the substantially planar upper surface;
    conducting one or more annealing steps to convert the implanted oxygen ions, nitrogen ions, or both oxygen and nitrogen ions in the first and second implantation regions of the semiconductor substrate into first and second patterned buried insulator layers, respectively, which are located at different depths from the substantially planar upper surface and are separated from each other by one or more interlayer gaps, wherein the first implantation region comprises first and second portions that are separated from each other by a gap, so that the first patterned buried insulator layer comprises first and second portions separated from each other by an intralayer gap, and the second patterned buried insulator layer is located above the intralayer gap and is separated from the first and second portions of the first patterned buried insulator layer by two interlayer gaps.

7. The method of claim 6, further comprising forming a field effect transistor (FET) that comprises: (1) a source region located in the SOI substrate over the first portion of the first patterned buried insulator layer, (2) a drain region located in the SOI substrate over the second portion of the first patterned buried insulator layer, and (3) a channel region located in the SOI substrate between the source and drain regions and above the second patterned buried insulator layer.

* * * * *